(12) United States Patent
Jing et al.

(10) Patent No.: US 10,617,040 B2
(45) Date of Patent: Apr. 7, 2020

(54) COOLING SYSTEM FOR DATA CENTER

(71) Applicant: BEIJING BAIDU NETCOM SCIENCE AND TECHNOLOGY CO., LTD., Beijing (CN)

(72) Inventors: Tangbo Jing, Beijing (CN); Tianyu Zhou, Beijing (CN); Binghua Zhang, Beijing (CN)

(73) Assignee: BEIJING BAIDU NETCOM SCIENCE AND TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 16/059,815

(22) Filed: Aug. 9, 2018

(65) Prior Publication Data
US 2019/0053404 A1 Feb. 14, 2019

(30) Foreign Application Priority Data

Aug. 11, 2017 (CN) .......................... 2017 1 0687708

(51) Int. Cl.
*H05K 7/20* (2006.01)
*H05K 7/14* (2006.01)

(52) U.S. Cl.
CPC ....... *H05K 7/20745* (2013.01); *H05K 7/1497* (2013.01); *H05K 7/2059* (2013.01); *H05K 7/20618* (2013.01)

(58) Field of Classification Search
CPC ............. H05K 7/2059; H05K 7/20618; H05K 7/20745; H05K 7/1497
USPC .................................................. 361/695–696
See application file for complete search history.

(56) References Cited

U.S. PATENT DOCUMENTS

| 5,526,626 A * | 6/1996 | Loucks ..................... E04D 1/08 428/906 |
| 8,141,374 B2 * | 3/2012 | Hay ................... H05K 7/20745 62/175 |
| 8,462,496 B2 * | 6/2013 | Schmitt ..................... G06F 1/20 165/104.33 |
| 8,893,814 B2 * | 11/2014 | Bui ..................... A62C 99/0072 169/16 |
| 8,943,757 B2 * | 2/2015 | Parizeau ................. E04H 1/005 52/79.1 |
| 9,719,713 B2 * | 8/2017 | Scarcella ............. B65D 88/744 |
| 2009/0145049 A1 * | 6/2009 | Roshdy ................... E04D 13/00 52/23 |
| 2012/0073783 A1 | 3/2012 | Nair |

(Continued)

FOREIGN PATENT DOCUMENTS

CN 105101737 A 11/2015

*Primary Examiner* — Zachary Pape
(74) *Attorney, Agent, or Firm* — Seed IP Law Group LLP

(57) ABSTRACT

An objective of the present disclosure is to provide a cooling system for a data center. The system includes: a cabinet hot aisle, disposed above a cabinet; a hot airflow passage, disposed at a top of the data center, a ventilating fan being disposed between the hot airflow passage and the cabinet hot aisle; an exterior wall heat exchanging structure, disposed on an exterior wall of the hot airflow passage, a surface of the exterior wall heat exchanging structure adopting a turbulent airflow heat exchanging structure; and a cold airflow passage, communicated with the cabinet, a natural cold air supply damper being disposed between the cold airflow passage and the hot airflow passage.

9 Claims, 4 Drawing Sheets

(56) References Cited

U.S. PATENT DOCUMENTS

2013/0244563 A1* 9/2013 Noteboom ............ F24F 11/0001
454/250
2014/0069127 A1* 3/2014 Bailey ................ H05K 7/20745
62/96

* cited by examiner

COOLING SYSTEM FOR DATA CENTER

CROSS-REFERENCE TO RELATED APPLICATIONS

This application is related to and claims priority from Chinese Application No. 201710687708.2, filed on Aug. 11, 2017 and entitled "Cooling System For Data Center," the entire disclosure of which is hereby incorporated by reference.

TECHNICAL FIELD

The present disclosure relates to a cooling system for a data center.

BACKGROUND

As energy costs are continuously rising and environmental protection is paid more attention, demands for energy conservation in a data center are becoming stronger. Under the premise of ensuring the safety and the high-performance operation of Information Technology (IT) equipments in the machine room of the data center, energy efficiency of the data center is improved and Power Usage Effectiveness (PUE) is reduced by comprehensively using various energy conservation approaches. Energy conservation and emission reduction has become one of purposes pursued by infrastructures in the data center.

In the conventional data center, a refrigerating unit provides chilled water to the end of an air conditioner to keep the IT equipments cooling down. The ratio of energy consumption of the refrigerating unit to energy consumption of the data center is about 40%. As a result, the energy consumption of the refrigerating unit is serious. Since the natural cooling (also called free cooling) system does not need the refrigerating unit to provide the cold source, energy consumption of the air conditioning system of the data center is significantly reduced, resulting in a remarkable energy conservation effect.

The common natural cooling systems include two types: the waterside natural cooling system and the air side natural cooling system. The water side natural cooling system is mainly to add a heat exchanger in addition to the original refrigerating unit. When a temperature of the outdoor environment is low, since the heat exchanger bypasses the refrigerating unit, outdoor cooling water is directly used to cool an indoor server. Although the water side natural cooling system is maturely and widely used, it occupies a large area and requires a number of heat exchanging operations. Accordingly, the energy conservation potential of the waterside natural cooling system is limited. The air side natural cooling system is to directly or indirectly cool the indoor server using outdoor cold air. Accordingly, the air side direct natural cooling system has a high heat exchanging efficiency and a large energy conservation potential. However, since there are risk factors such as outdoor environmental pollution and humidity, the reliability of the air side natural cooling system is risky. An optimization scheme is to indirectly exchange heat through an air-air heat exchanger to avoid this problem. However, the heat exchanger has a large size, a high cost, and a low heat exchanging efficiency.

The existing air side energy conservation natural cooling scheme for the data center generally adopts a special air conditioning unit with fresh air functions such as a direct fresh air unit or an indirect fresh air unit. However, the air conditioning unit is not adapted to the machine room building well, and requires the machine room to reserve a large amount of space for placement, air passage, or a maintenance area. Meanwhile, the existing air side energy conservation units need to be provided with a multi-layer filter screen to remove the pollution of the outdoor environment. However, the filter screen generates a large airflow resistance, which increases power consumption of a circulating fan and weakens the energy conservation effect. Moreover, the filter screen needs to be frequently replaced and maintained, which increases the operating complexity and cost. In addition, the existing natural cooling units are generally equipped with a compact multi-row heat exchanger to achieve requirements of heat exchange and humidity control. However, the heat exchanger may cause an adverse influence on the air resistance of the system, and simultaneously weaken the energy conservation effect.

SUMMARY

An objective of the present disclosure is to provide a cooling system for a data center.

According to one aspect of the present disclosure, a cooling system for a data center is provided. The system includes: a cabinet hot aisle, disposed above a cabinet; a hot airflow passage, disposed at a top of the data center, a ventilating fan being disposed between the hot airflow passage and the cabinet hot aisle; an exterior wall heat exchanging structure, disposed on an exterior wall of the hot airflow passage, a surface of the exterior wall heat exchanging structure adopting a turbulent airflow heat exchanging structure; and a cold airflow passage, communicated with the cabinet, a natural cold air supply damper being disposed between the cold airflow passage and the hot airflow passage.

In contrast to the existing technology, the present disclosure provides a passive natural cooling system for the data center. Heat dissipation is performed using a building exterior wall of the data center. When an outdoor air condition can satisfy a heat dissipation requirement of the data center, it is possible that the refrigerating unit is completely unnecessary. Accordingly, the system efficiency is significantly improved, and PUE is reduced. The present disclosure may provide a new practicable scheme for an air conditioning system architecture of the data center and construction of a new machine room, and may significantly reduce the operating energy consumption of an air conditioning system of the data center, resulting in a remarkable energy conservation effect.

BRIEF DESCRIPTION OF THE DRAWINGS

After reading detailed descriptions of non-limiting embodiments given with reference to the following accompanying drawings, other features, objectives and advantages of the present disclosure will be more apparent.

The same or similar reference numerals in the accompanying drawings represent the same or similar components.

DETAILED DESCRIPTION OF EMBODIMENTS

Before exemplary embodiments are discussed in more detail, it should be noted that some exemplary embodiments are described as processes or methods depicted as flowcharts. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the accompanying drawings. The processes may correspond to methods, functions, procedures, subroutines, or subprograms.

Specific structures and functional details disclosed herein are merely representative for purposes of describing exemplary embodiments of the present disclosure. The present disclosure, however, may be embodied in many alternative forms and should not be interpreted as limited to only the embodiments set forth herein.

It should be understood that, although the terms "first," or "second," may be used herein to describe various units, these units should not be limited by these terms. These terms are only used to distinguish one unit from another. For example, without departing from the scope of exemplary embodiments, a first unit could be termed a second unit, and similarly, a second unit could be termed a first unit. As used herein, the term "and/or" includes any and all combinations of one or more of the associated listed items.

The terminology used herein is for the purpose of describing particular embodiments only and is not intended to limit the exemplary embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, units and/or components, but do not preclude the presence or addition of one or more other features, integers, steps, operations, units, components and/or combinations thereof.

It should also be noted that in some alternative implementations, the functions/actions mentioned may occur out of the order annotated in the accompanying drawings. For example, two drawings shown in succession may in fact be performed concurrently or may sometimes be performed in the reverse order, depending upon the functions/actions involved.

The present disclosure is further described below in detail with reference to the accompanying drawings.

Figure 1:
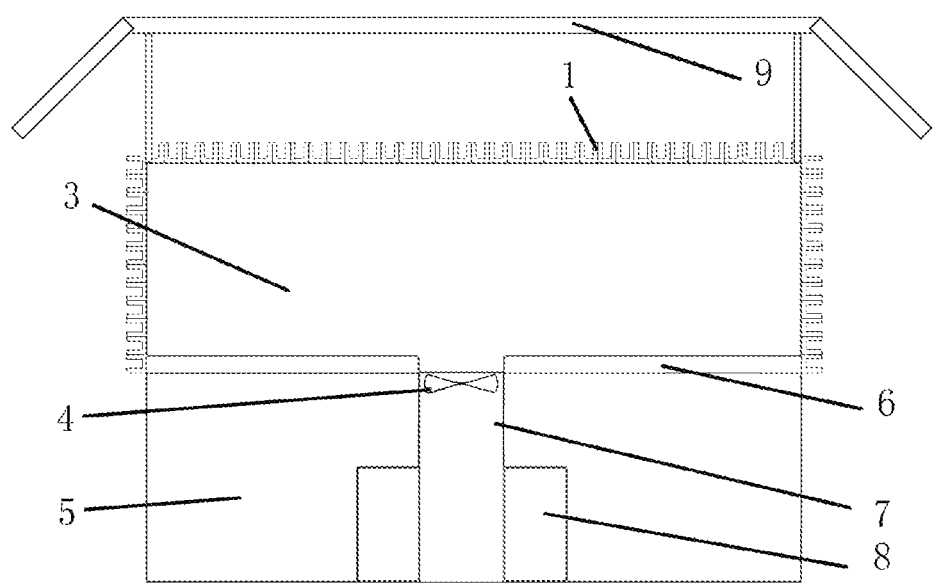
FIG. 1 is a schematic diagram of a cooling system for a data center according to an embodiment of the present disclosure.

FIG. 1 is a schematic diagram of a system according to an embodiment the present disclosure, and illustrates a cooling system for a data center.

As shown in FIG. 1, the cooling system includes a cabinet hot aisle 7, a ventilating fan 4, a hot airflow passage 3, an exterior wall heat exchanging structure 1, a natural cold air supply damper 6, and a cold airflow passage 5.

Specifically, a plurality of sets of cabinets (IT servers) 8 are disposed in a data center. The cabinet hot aisle 7 is disposed above the cabinets 8, and the ventilating fan 4 is disposed between the cabinet hot aisle 7 and the hot airflow passage 3 at the top of the data center. The cabinet hot aisle 7 collects hot air exhausted from the cabinets 8, and the hot air is introduced into the hot airflow passage 3 through the ventilating fan 4.

The exterior wall heat exchanging structure 1 is disposed on the exterior wall of the building including the hot airflow passage 3. The surface of the exterior wall heat exchanging structure 1 adopts a turbulent airflow heat exchanging structure, including, but not limited to, a ribbed structure or a granular structure that may strengthen turbulent airflow heat exchange of the outdoor air, which is conductive to expanding a heat exchange area. Heat exchange is performed between the hot air entering the hot airflow passage 3 and the outdoor air through the exterior wall heat exchanging structure 1. Since this heat exchange mode is to use an external natural cold source, it is also referred to as a natural cooling mode in the present disclosure.

The natural cold air supply damper 6 is disposed between the hot airflow passage 3 and the cold airflow passage 5. After the natural cold air supply damper 6 is opened, the cold air obtained through the heat exchange performed by the exterior wall heat exchanging structure 1 is supplied to the cold airflow passage 5, and then to the cabinet 8 communicated with the cold airflow passage 5, thereby completing the airflow circulation of the data center.

Alternatively, still referring to FIG. 1 , the cooling system may further include an outdoor awning 9 disposed above the exterior wall heat exchanging structure 1. This ensures that the roof of the data center is protected from the radiation generated by direct sunlight, which may reduce the temperature of the air outside the exterior wall heat exchanging structure 1 and extend the applicable time of the cooling system at the same time.

The present disclosure provides a solution for passively performing natural cooling and heat dissipation using the building exterior wall. In the data center, the hot air exhausted from the IT server is introduced into the hot airflow passage at the top, and flows through the interior of the building exterior wall at the top. Accordingly, the heat exchange is performed between the hot air and the outdoor air through the exterior wall heat exchanging structure having an efficiently extended surface, which may significantly reduce the energy consumption of the air conditioning system in the data center, resulting in a remarkable energy conservation effect.

When the passive heat dissipation of the building exterior wall fails to meet the requirement, the cooling system may introduce a mechanical cooling mode to achieve the heat dissipation for the entire data center. For detailed explanations, reference is made to descriptions of FIG. 2.

Figure 2:
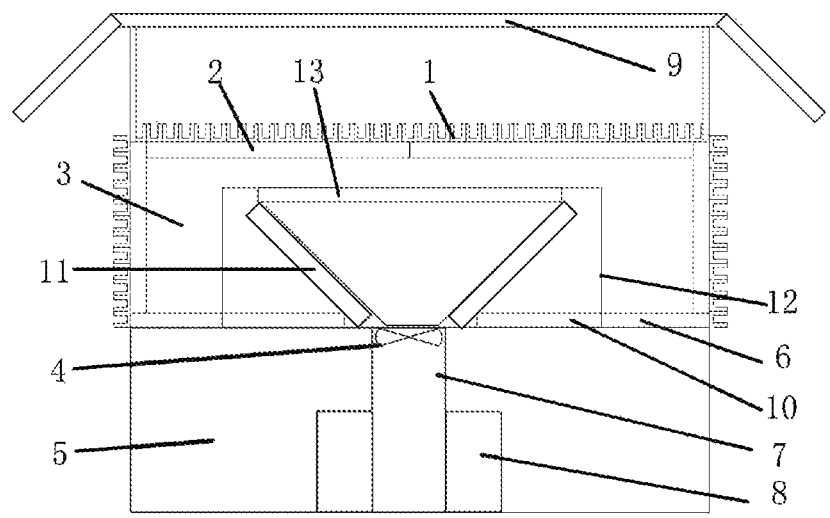
FIG. 2 is a schematic diagram of a cooling system for a data center according to another embodiment of the present disclosure.

FIG. 2 is a schematic diagram of a system according to an embodiment of the present disclosure, and illustrates a cooling system for a data center. The cooling system may provide a variety of cooling modes.

As shown in FIG. 2, the cooling system includes a cabinet hot aisle 7, a ventilating fan 4, an isolation passage 12, a hot airflow passage 3, an exterior wall heat exchanging structure 1, a natural cold air supply damper 6, and a cold airflow passage 5. The isolation passage 12 further includes a refrigerating coiled pipe 11, a ventilating air damper 13 and a mechanical cold air supply damper 10.

The isolation passage 12 is disposed within the hot airflow passage 3 and is communicated with the cabinet hot aisle 7 via the ventilating fan 4.

The isolation passage 12 may be communicated with or isolated from the hot airflow passage 3 via the ventilating air damper 13. When the ventilating air damper 13 is opened, the hot air introduced via the ventilating fan 4 first enters the isolation passage 12, and may then enter the hot airflow passage 3 through the ventilating air damper 13. When the ventilating air damper 13 is closed, the hot air introduced via the ventilating fan 4 is limited to the isolation passage 12 and cannot enter the hot airflow passage 3.

The isolation passage 12 is also communicated with or isolated from the cold airflow passage 5 via the mechanical cold air supply damper 10. When the mechanical cold air supply damper 10 is opened, the cold air cooled by the refrigerating coiled pipe 11 may enter the cold airflow passage 5 through the mechanical cold air supply damper 10. When the mechanical cold air supply damper 10 is closed, the isolation passage 12 is isolated from the cold airflow passage 5.

The cooling system shown in FIG. 2 may provide three cooling modes. The cooling system compares an air condition in the hot airflow passage 3 with an outdoor air condition including temperature or humidity in real time, to determine the currently used cooling mode. The specific description is as follows.

1. Natural cooling mode is as follows.

Airflow cooling process: the air from the cabinet 8 enters (→) the cabinet hot aisle 7→the ventilating fan 4→the hot airflow passage 3→the exterior wall heat exchanging structure 1→the natural cold air supply damper 6→the cabinet 8.

Figure 3:
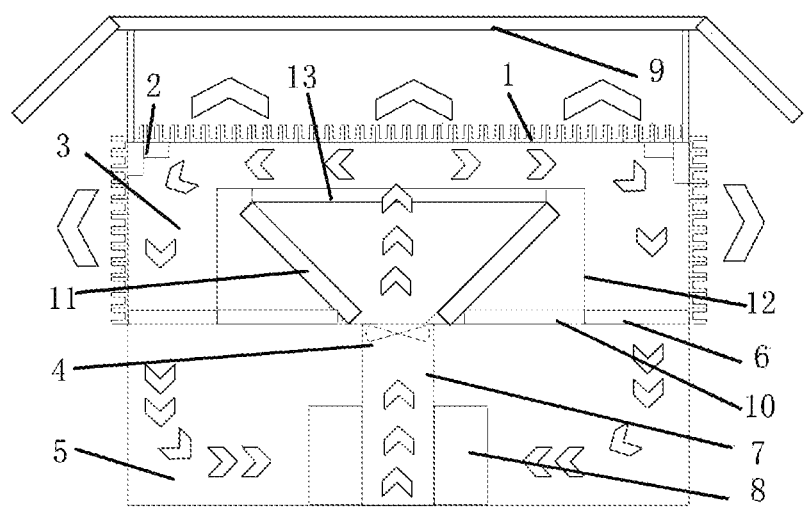
FIG. 3 is a schematic diagram of operating in a natural cooling mode according to an embodiment of the present disclosure.

Referring to FIGS. 2 and 3, the cabinet hot aisle 7 collects the hot air generated by the cabinet 8, and the hot air is introduced into the hot airflow passage 3 through the ventilating fan 4 and the ventilating air damper 13. The cold air obtained through the heat exchange performed by the exterior wall heat exchanging structure 1 is supplied to the cold airflow passage 5 through the natural cold air supply damper 6, and then to the cabinet 8.

Opening states of electric air dampers: the ventilating air damper 13 and the natural cold air supply damper 6 are opened; the mechanical cold air supply damper 10 is closed.

In this mode, the ventilating air damper 13 and the natural cold air supply damper 6 are opened, so that the hot air enters the hot airflow passage 3 and the cold air obtained through the heat exchange performed by the exterior wall heat exchanging structure 1 enters the cold airflow passage 5. At the same time, the mechanical cold air supply damper 10 in the isolation passage 12 is closed.

When the outdoor temperature is low (i.e., in winter) the natural cooling mode may effectively cool the data center.

2. Natural cooling mode plus (+) mechanical cooling mode (hybrid cooling mode) is as follows.

Airflow cooling process: the air from the cabinet 8 enters (→) the cabinet hot aisle 7→the ventilating fan 4→the refrigerating coiled pipe 11 +the ventilating air damper 13+the hot airflow passage 3→the mechanical supply air damper 9+the natural cold air supply damper 6→the exterior wall heat exchanging structure 1→the cabinet 8

Figure 4:
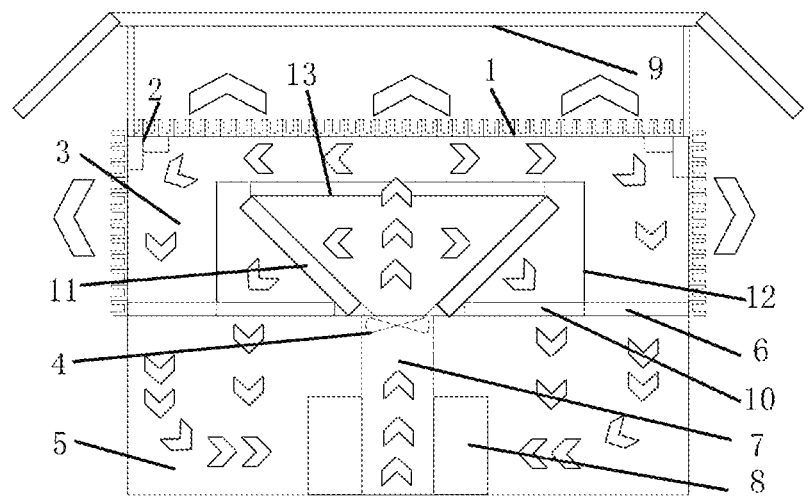
FIG. 4 is a schematic diagram of operating in a hybrid cooling mode according to an embodiment of the present disclosure.

Referring to FIGS. 2 and 4, the cabinet hot aisle 7 collects the hot air generated by the cabinet 8, and the hot air first enters the isolation passage 12 through the ventilating fan 4.

A part of the hot air is introduced into the hot airflow passage 3 through the ventilating air damper 13. The cold air obtained through the heat exchange performed by the exterior wall heat exchanging structure 1 is supplied to the cold airflow passage 5 through the natural cold air supply damper 6, and then to the cabinet 8.

Apart of the hot air is cooled by the refrigerating coiled pipe 11 in the isolation passage 12, supplied to the cold airflow passage 5 through the mechanical cold air supply damper 10, and then to the cabinet 8.

Here, the isolation passage 12 isolates the cold air cooled by the refrigerating coiled pipe 11 from the hot air in the hot airflow passage 3, and introduces the cold air into the cold airflow passage 5 through the mechanical cold air supply damper 10. The isolation passage 12 isolates the natural cold air supply from the mechanical cold air supply to prevent airflow short circuit.

Opening states of the electric air dampers: the ventilating air damper 13, the mechanical cold air supply damper 10, and the natural cold air supply damper 6 are opened; none of the electric air dampers is closed.

In this mode, the ventilating air damper 13 and the natural cold air supply damper 6 are opened, so that the hot air enters the hot airflow passage 3 and the cold air obtained through the heat exchange performed by the exterior wall heat exchanging structure 1 enters the cold airflow passage 5. At the same time, the mechanical cold air supply damper 10 in the isolation passage 12 is also opened, so that the cold air cooled by the refrigerating coiled pipe 11 enters the cold airflow passage 5, too.

When the outdoor air condition is similar to a preset environment requirement of the machine room, for example, when the outdoor temperature is high and the separate natural cooling mode may not meet the heat dissipation requirement of the data center, for example, when the outdoor temperature is slightly higher in spring and autumn, the mechanical cooling mode may be enabled at the same time to cool the data center.

3. Mechanical cooling mode is as follows.

Airflow cooling process: the air from the cabinet 8 enters (→) the cabinet hot aisle 7→the ventilating fan 4→the refrigerating coiled pipe 11→the mechanical cold air supply damper 10→the cabinet 8

Figure 5:
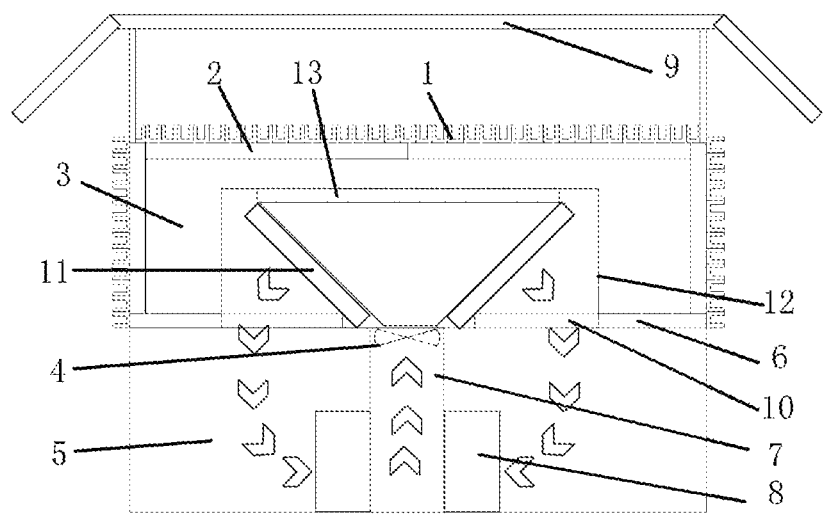
FIG. 5 is a schematic diagram of operating in a mechanical cooling mode according to an embodiment of the present disclosure.

Referring to FIGS. 2 and 5, the cabinet hot aisle 7 collects the hot air generated by the cabinet 8. The hot air enters the isolation passage 12 through the ventilating fan 4, and then cooled by the refrigerating coiled pipe 11 to be supplied to the cold airflow passage 5 through the mechanical cold air supply damper 10, and then to the cabinet 8.

Opening states of the electric air dampers: the mechanical cold air supply damper 10 is opened; the ventilating air damper 13 and the natural cold air supply damper 6 are closed.

In this mode, the ventilating air damper 13 is closed. The isolation passage 12 restricts the hot air to the mechanical cooling mode, and the mechanical cold air supply damper 10 is opened, so that the cold air cooled by the refrigerating coiled pipe 11 may enter the cold airflow passage 5.

When the outdoor air condition is higher than the preset environment requirement of the machine room, for example, when the outdoor temperature is high, the natural cooling mode may not be able to effectively cool the data center, for example, in summer, the mechanical cooling mode may make the heat dissipation requirement of the data center satisfied.

Alternatively, still referring to FIG. 2, the cooling system may further include an interior wall insulation structure 2 disposed on the interior wall of the hot airflow passage 3. The interior wall insulation structure is to insulate the heat exchange performed by the exterior wall heat exchanging structure 1 by spreading the insulation material, or perform the heat exchange using the exterior wall heat exchanging structure 1 by shrinking the insulation material.

Here, the used insulation material is, for example, EPS (expandable polystyrene), XPS (extruded polystyrene), rock wool board or glass wool board.

In the natural cooling mode, referring to FIGS. 2 and 3, the interior wall insulation structure 2 shrinks the insulation material, so that the exterior wall heat exchanging structure 1 uses the outdoor air to exchange heat with the hot air generated by the cabinet 8.

In the hybrid cooling mode, referring to FIGS. 2 and 4, the interior wall insulation structure 2 also shrinks the insulation material, so that the exterior wall heat exchanging structure 1 uses the outdoor air to exchange heat with the hot air generated by the cabinet 8.

In the mechanical cooling mode, referring to FIGS. 2 and 5, the interior wall insulation structure 2 spreads the insulation material to insulate the heat exchange performed by the exterior wall heat exchanging structure 1. The interior wall insulation structure 2 may reduce the thermal load of the building envelope structure, thereby reducing the energy consumption of the mechanical refrigeration.

Figure 6:
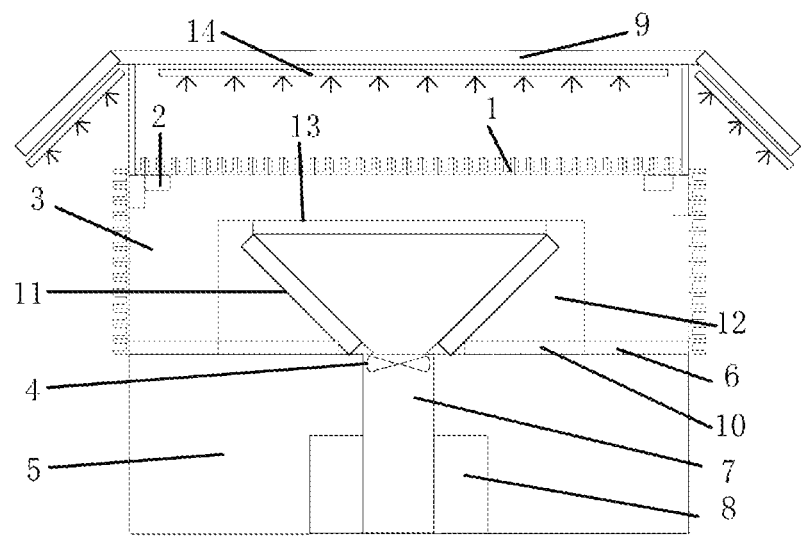
FIG. 6 is a schematic diagram of a cooling system for a data center according to another embodiment of the present disclosure.

FIG. 6 is a schematic diagram of a system according to an embodiment of the present disclosure, and illustrates a cooling system with a spraying system for a data center.

As shown in FIG. 6, the cooling system may further include a spraying system 14, for example, include a plurality of spray heads. The spraying system is disposed outside the exterior wall heat exchanging structure 1, and spraying the exterior wall heat exchanging structure 1, which may increase the natural cooling time, to make the system more energy efficient.

Further, still referring to FIG. 6, the cooling system may further include an outdoor awning 9. The spraying system 14 may be disposed below the outdoor awning 9. That is, the spraying system 14 is disposed below the outdoor awning 9 and above the exterior wall heat exchanging structure 1, which may effectively extend the applicable time of the cooling system of the present disclosure.

To those skilled in the art, it is apparent that the present disclosure is not limited to the details of the above exemplary embodiments, and the present disclosure can be implemented in other specific forms without departing from the spirit or basic features of the present disclosure. Thus, in any way, the embodiments should be regarded as exemplary, not limitative; the scope of the present disclosure is limited by the appended claims, instead of the above description. Therefore, all variations intended to fall into the meaning and scope of equivalent elements of the claims should be covered within the present disclosure.

What is claimed is:

1. A cooling system for a data center, comprising:
   a cabinet hot aisle, disposed above a cabinet;
   a hot airflow passage, disposed at a top of the data center, a ventilating fan being disposed between the hot airflow passage and the cabinet hot aisle;
   an exterior wall heat exchanging structure, disposed on an exterior wall of the hot airflow passage, a surface of the exterior wall heat exchanging structure adopting a turbulent airflow heat exchanging structure;
   a cold airflow passage, communicated with the cabinet, a natural cold air supply damper being disposed between the cold airflow passage and the hot airflow passage; and
   an isolation passage, disposed with a refrigerating coiled pipe, a ventilating air damper, and a mechanical cold air supply damper therein, disposed in the hot airflow passage and communicated with or isolated from the hot airflow passage via the ventilating air damper, communicated with or isolated from the cold airflow passage via the mechanical cold air supply damper, and communicated with the cabinet hot aisle via the ventilating fan.

2. The system according to claim 1, further comprising:
   an outdoor awning, disposed above the exterior wall heat exchanging structure.

3. The system according to claim 1, further comprising:
   a spraying system, disposed outside the exterior wall heat exchanging structure and spraying the exterior wall heat exchanging structure.

4. The system according to claim 1, wherein hot air exhausted by the cabinet is collected by the cabinet hot aisle, and introduced into the hot airflow passage through the ventilating fan, cold air obtained through heat exchange performed by the exterior wall heat exchanging structure is introduced into the cold airflow passage through the natural cold air supply damper, and supplied back to the cabinet.

5. The system according to claim 1, wherein the isolation passage is isolated from the hot airflow passage via the ventilating air damper, and communicated with the cold airflow passage via the mechanical cold air supply damper,
   wherein the hot air exhausted by the cabinet is collected by the cabinet hot aisle, and introduced into the isolation passage through the ventilating fan, cold air cooled by the refrigerating coiled pipe enters the cold airflow passage through the mechanical cold air supply damper, and is supplied back to the cabinet.

6. The system according to claim 1, wherein the isolation passage is communicated with the hot airflow passage via the ventilating air damper, and communicated with the cold airflow passage via the mechanical cold air supply damper,
   wherein the hot air exhausted by the cabinet is collected by the cabinet hot aisle and introduced into the isolation passage through the ventilating fan, wherein a part of the hot air continues to enter the hot airflow passage through the ventilating air damper, cold air obtained through the heat exchange performed by the exterior wall heat exchanging structure is introduced into the cold airflow passage through the natural cold air supply damper, and a part of the hot air enters the cold airflow passage through the mechanical cold air supply damper after being cooled by the refrigerating coiled pipe.

7. The system according to claim 1, wherein the isolation passage is communicated with the hot airflow passage via the ventilating air damper, and isolated from the cold airflow passage via the mechanical cold air supply damper,
   wherein the hot air exhausted by the cabinet is collected by the cabinet hot aisle, and introduced into the hot airflow passage through the ventilating fan and the ventilating air damper, cold air obtained through the heat exchange performed by the exterior wall heat exchanging structure is introduced into the cold airflow passage through the natural cold air supply damper, and supplied back to the cabinet.

8. The system according to claim 1, further comprising:
   an interior wall insulation structure, disposed on an interior wall of the hot airflow passage to insulate the heat exchange performed by the exterior wall heat exchanging structure by spreading an insulation material or enable the heat exchange performed by the exterior wall heat exchanging structure by shrinking the insulation material.

9. The system according to claim 1, wherein the turbulent airflow heat exchanging structure adopted by the surface of the exterior wall heat exchanging structure includes a ribbed structure or a granular structure.

* * * * *